(12) United States Patent
Shaviv (10) Patent No.: US 7,670,931 B2
(45) Date of Patent: Mar. 2, 2010

(54) METHODS FOR FABRICATING SEMICONDUCTOR STRUCTURES WITH BACKSIDE STRESS LAYERS

(75) Inventor: Roey Shaviv, Palo Alto, CA (US)

(73) Assignee: Novellus Systems, Inc., San Jose, CA (US)

( * ) Notice: Subject to any disclaimer, the term of this patent is extended or adjusted under 35 U.S.C. 154(b) by 261 days.

(21) Appl. No.: 11/748,738

(22) Filed: May 15, 2007

(65) Prior Publication Data

US 2008/0286918 A1 Nov. 20, 2008

(51) Int. Cl.
*H01L 21/322* (2006.01)

(52) U.S. Cl. .................. 438/476; 257/347; 438/477

(58) Field of Classification Search ......... 438/471–476, 438/455–459

See application file for complete search history.

(56) References Cited

U.S. PATENT DOCUMENTS

| | | | |
|---|---|---|---|
| 5,856,230 A | | 1/1999 | Jang |
| 5,866,452 A | | 2/1999 | Willer et al. |
| 6,165,835 A | | 12/2000 | Wendt et al. |
| 6,808,952 B1 | | 10/2004 | Sniegowski et al. |
| 7,208,380 B2 * | | 4/2007 | Krishnan et al. ............ 438/287 |
| 7,371,630 B2 * | | 5/2008 | Vandentop et al. .......... 438/199 |
| 7,402,866 B2 * | | 7/2008 | Liang et al. ................. 257/347 |
| 2002/0132393 A1 | | 9/2002 | Kraxenberger et al. |
| 2004/0104491 A1 | | 6/2004 | Connell et al. |
| 2005/0148139 A1 * | | 7/2005 | Sashida ..................... 438/239 |
| 2005/0208776 A1 * | | 9/2005 | Krishnan et al. ............ 438/770 |
| 2005/0255674 A1 * | | 11/2005 | Nanjo ........................ 438/460 |
| 2006/0024873 A1 * | | 2/2006 | Nandakumar et al. ....... 438/197 |
| 2006/0131584 A1 * | | 6/2006 | Buss ............................. 257/63 |
| 2006/0263959 A1 * | | 11/2006 | Lin et al. .................... 438/197 |
| 2007/0004192 A1 * | | 1/2007 | Park et al. ................... 438/622 |

FOREIGN PATENT DOCUMENTS

| | | |
|---|---|---|
| JP | 06188249 A | 7/1994 |
| JP | 2006120703 | 5/2006 |
| WO | 0022205 | 4/2000 |
| WO | 2006053213 A1 | 5/2006 |

* cited by examiner

*Primary Examiner*—Zandra Smith
*Assistant Examiner*—Ali Naraghi
(74) *Attorney, Agent, or Firm*—Ingrassia Fisher & Lorenz, P.C.

(57) ABSTRACT

Methods for fabricating semiconductor structures with backside stress layers are provided. In one exemplary embodiment, the method comprises the steps of providing a semiconductor device formed on and within a front surface of a semiconductor substrate. The semiconductor device comprises a channel region. A plurality of dielectric layers is formed overlying the semiconductor device. The plurality of dielectric layers comprises conductive connections that are in electrical communication with the semiconductor device. A backside stress layer is formed on a back surface of the semiconductor substrate. The backside stress layer is configured to apply to the channel region of the semiconductor device a uniaxial compressive or tensile stress that, with stresses applied by the plurality of dielectric layers, results in an overall stress exerted on the channel region to achieve a predetermined overall strain of the channel region.

20 Claims, 7 Drawing Sheets

METHODS FOR FABRICATING SEMICONDUCTOR STRUCTURES WITH BACKSIDE STRESS LAYERS

FIELD OF THE INVENTION

The present invention generally relates to methods for fabricating semiconductor structures, and more particularly relates to methods for fabricating semiconductor structures with backside stress layers.

BACKGROUND OF THE INVENTION

The majority of present day integrated circuits (ICs) are implemented by using a plurality of interconnected field effect transistors (FETs), such as, for example, junction field-effect transistors (JFETs) and metal oxide semiconductor field effect transistors (MOSFETs or MOS transistors). A JFET is a type of transistor in which the current flow through a channel of the device between a drain electrode and a source electrode is controlled by the voltage applied to a gate electrode. An MOS transistor includes a gate electrode as a control electrode that is formed overlying a semiconductor substrate and spaced-apart source and drain regions that are formed within the semiconductor substrate and between which a current can flow. A control voltage applied to the gate electrode controls the flow of current through a channel in the semiconductor substrate between the source and drain regions and beneath the gate electrode. Usually both P-channel FETs (PMOS transistors) and N-channel FETs (NMOS transistors) are used to form ICs.

FET transistors, in contrast to bipolar transistors, are majority carrier devices. For example, the gain of an MOS transistor, usually defined by the transconductance ($g_m$), is proportional to the mobility of the majority carriers in the transistor channel. The current-carrying capability of an MOS transistor is proportional to the mobility of the majority carriers in the channel. The mobility of electrons, the majority carrier in an NMOS transistor, can be increased by applying a longitudinal tensile stress to the channel. The tensile stress caused by the differential contraction can thus improve the performance of an NMOS transistor. Similarly, the mobility of holes, the majority carrier in a PMOS transistor, can be increased by applying a longitudinal compressive stress to the channel, thus improving the performance of the PMOS transistor.

Various methods have been used to apply stress layers to FET structures, although such methods often suffer from significant drawbacks. For example, conductive contacts to the source/drain regions often are formed through a stress layer that has been applied to the top or front side of the transistors, that is, overlying the gate electrodes. However, this interruption of the stress layer by a conductive contact compromises the integrity of the stress layer, thus decreasing the stress it applies to the channel regions. In addition, methods that form the stress layer on the backside of the transistors, that is, underlying the semiconductor substrate on and within which the transistors have been formed, typically do so early in the transistor fabrication, such as after impurity doping of source/drain regions. Thus, the stress layer is subjected to subsequent thermal processing of the transistor structure, which also can jeopardize the integrity of the stress layer. Further, if the stress layer is formed on the backside of the FET structure early in the FET structure fabrication, the stress layer often is removed when the structure is thinned for packaging and assembly. Thus, the final structure cannot benefit from the presence of the stress layer when the structure is in operation.

Accordingly, it is desirable to provide methods for fabricating a semiconductor structure having a backside stress layer that is formed after fabrication of a semiconductor device and before packaging and assembly. In addition, it is desirable to provide methods for fabricating a semiconductor structure having a backside stress layer that is formed after thermal processing steps. It also is desirable to provide methods for fabricating a semiconductor structure having backside stress layers that are not removed from the structure before packaging and assembly. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating a semiconductor structure in accordance with an exemplary embodiment of the present invention is provided. The method comprises the steps of providing a semiconductor device formed on and within a front surface of a semiconductor substrate. The semiconductor device comprises a channel region. A plurality of dielectric layers is formed overlying the semiconductor device. The plurality of dielectric layers comprises conductive connections that are in electrical communication with the semiconductor device. A backside stress layer is formed on a back surface of the semiconductor substrate. The backside stress layer is configured to apply to the channel region of the semiconductor device a uniaxial compressive or tensile stress that, with stresses applied by the plurality of dielectric layers, results in an overall stress exerted on the channel region to achieve a predetermined overall strain of the channel region.

A method for fabricating a semiconductor structure in accordance with another exemplary embodiment of the invention is provided. The method comprises the steps of providing a semiconductor substrate having a front surface and a back surface and fabricating a first MOS transistor and a second MOS transistor on and within the front surface of the semiconductor substrate. The first MOS transistor and the second MOS transistor each comprise a channel region. A plurality of dielectric layers comprising conductive connections that are in electrical communication with the MOS transistors is formed overlying the first and second MOS transistors. After the step of forming the plurality of dielectric layers, a backside stress layer is formed on the back surface of the semiconductor substrate underlying at least one of the first and second MOS transistors.

A method for improving the performance of a semiconductor structure in accordance with another exemplary embodiment of the invention is provided. The method comprises the steps of providing a semiconductor structure comprising a semiconductor substrate having a semiconductor device formed on and within a front surface of the semiconductor substrate and a plurality of dielectric layers overlying the semiconductor structure. The plurality of dielectric layers comprises conductive connections that are in electrical communication with the semiconductor device. A portion of the semiconductor substrate is removed from a back surface of the semiconductor substrate. A stress layer is formed on the back surface of the semiconductor substrate underlying the semiconductor device.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 1-7 illustrate, in cross section, a method for forming a semiconductor structure 100 in accordance with an exemplary embodiment of the invention. For convenience, the method will be described with reference to the fabrication of a semiconductor structure having MOS transistors. However, it will be understood that the method can be used for the fabrication of a semiconductor structure having other semiconductor devices, such as, for example, junction FETs (JFETs). Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the manufacture of MOS components are well known and so, in the interest of brevity, many conventional steps will only be mentioned briefly herein or will be omitted entirely without providing the well known process details.

Figure 1:
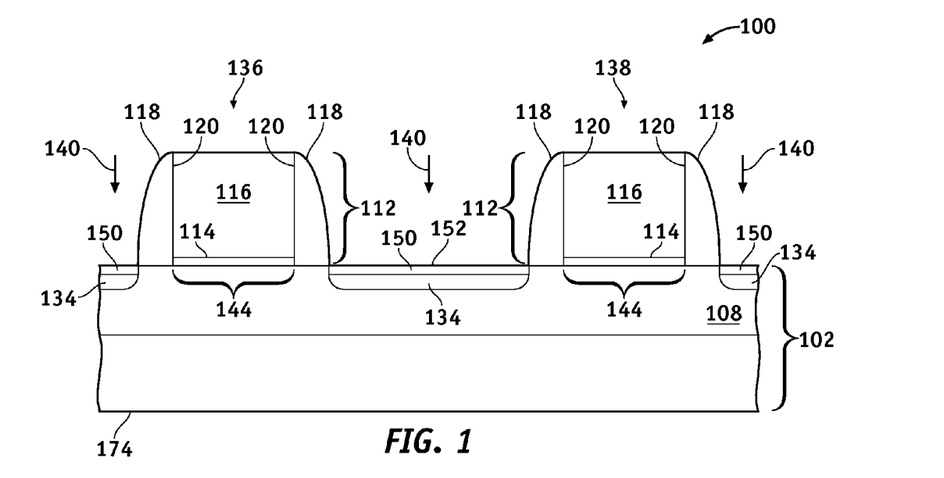
FIGS. 1-7 illustrate, in cross section, a method for fabricating a semiconductor structure in accordance with an exemplary embodiment of the present invention.

Referring to FIG. 1, the method begins by providing MOS gate stacks 112 overlying a semiconductor substrate 102. The semiconductor substrate is preferably a silicon substrate wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. The semiconductor substrate will hereinafter be referred to for convenience, but without limitation, as a silicon substrate. The silicon substrate may be a bulk silicon wafer, or may be a thin layer of silicon on an insulating layer (commonly know as silicon-on-insulator or SOI) that, in turn, is supported by a carrier wafer. At least a surface portion 108 of the silicon substrate 102 is impurity doped, for example by forming N-type well regions and P-type well regions for the fabrication of P-channel (PMOS) transistors and N-channel (NMOS) transistors, respectively. Semiconductor substrate has a front surface or side 152 and a back surface or side 174.

In the conventional processing, the gate stacks 112 comprise a gate insulator 114 and an overlying gate electrode 116. The gate insulator 114 can be formed of a layer of thermally grown silicon dioxide or, alternatively (as illustrated), a deposited insulator such as a silicon oxide, silicon nitride, high dielectric constant materials such as hafnium oxide, or the like. The gate electrode 116 may be formed of a conductive material, such as a metal or impurity-doped polycrystalline silicon. Sidewall spacers 118 are formed on the sidewalls 120 of gate stacks 112. The sidewall spacers 118 are formed by depositing layer of insulating material such as silicon oxide, silicon nitride, or the like and subsequently anisotropically etching the insulating layer, for example by RIE. It will be appreciated that, while only spacers 118 are illustrated, additional spacers may be formed during the fabrication of semiconductor structure 100.

The gate stacks 112 and the spacers 118 then are used as ion implantation masks to form source and drain regions 134 in silicon substrate 102, thus forming a first MOS transistor 136 and a second MOS transistor 138. The source and drain regions are formed by appropriately impurity doping silicon substrate 102 in known manner, for example, by ion implantation of dopant ions, illustrated by arrows 140, and subsequent thermal annealing. For an N-channel MOS transistor, the source and drain regions 134 are preferably formed by implanting arsenic ions, although phosphorus ions could also be used. For a P-channel MOS transistor, the source and drain regions 134 are preferably formed by implanting boron ions. Channel regions 144 underlie the gate electrodes 116 between the source/drain regions 134 of the semiconductor substrate 102. While semiconductor structure 100 is illustrated with only two MOS transistors, it will be appreciated that semiconductor structure 100 may have any number of NMOS transistors and/or PMOS transistors. Those of skill in the art will appreciate that structure 100 may include a large number of such transistors as required to implement a desired circuit function. In addition, it will be appreciated that MOS transistors 136 and 138 can both be NMOS transistors or PMOS transistors or, alternatively, transistor 136 can be an NMOS transistor and transistor 138 can be a PMOS transistor with the transistors separated by shallow trench isolation (STI) that extends from front surface 152 into semiconductor substrate 102, as is known in the art.

A blanket layer of silicide-forming metal (not shown) is deposited on front surface 152 of semiconductor substrate 102, gate stacks 112, and spacers 118 and is heated, for example by RTA, to form a metal silicide layer 150 on front surface 152. If gate electrodes 116 are formed of a polycrystalline silicon material, metal silicide layers (not shown) may also form on the gate electrodes. In an alternative embodiment, a mask used to form gate stacks 112 is not removed after formation of the gate stacks so that formation of a metal silicide layer on the polycrystalline silicon gate electrodes is prevented. Any silicide-forming metal that is not in contact with exposed silicon of substrate 102 and does not react during the RTA to form a silicide may subsequently be removed by wet etching in a $H_2O_2/H_2SO_4$ or $HNO_3/HCl$ solution.

Figure 2:
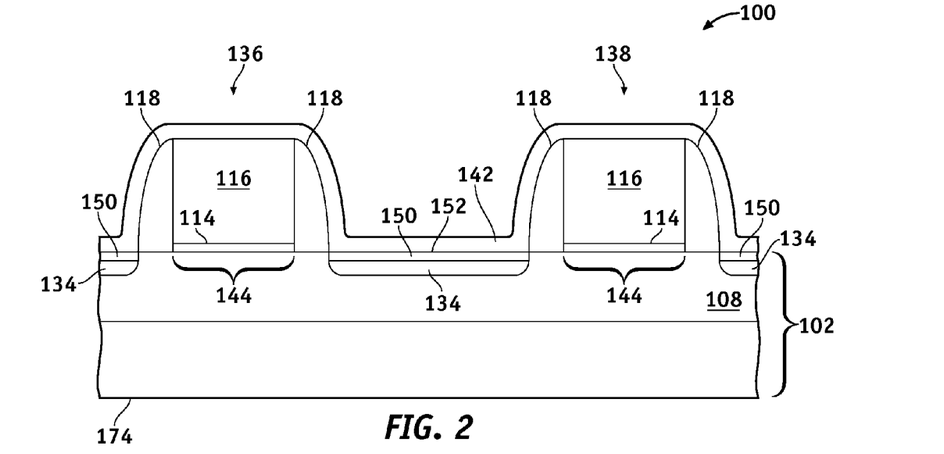

In one exemplary embodiment, referring to FIG. 2, one or more frontside highly intrinsically-stressed layers 142 may be formed overlying at least a portion of the source/drain regions 134 of one or both of transistors 136 and 138. As used herein, the term "frontside stress layer" refers to a stress layer that is formed overlying at least a portion of the source/drain regions 134 on and within a front surface of a semiconductor substrate. The highly intrinsically-stressed layer 142 produces strain in the channels 144 underlying the gate electrodes 116 so that the carrier mobility in the channels is increased, which, in turn, increases the operation speed of transistor. For example, a tensile strain-inducing silicon nitride layer can be deposited onto an NMOS transistor by chemical vapor deposition (CVD) or plasma-enhanced CVD (PECVD) deposition. This tensile strain of the channel increases electron mobility, thus increasing the operational speed of the NMOS transistor. Conversely, a compressive strain-inducing layer can be deposited onto a PMOS transistor to increase hole mobility, thus increasing the operational speed of the PMOS transistor. Alternatively, the highly intrinsically-stressed layer can be used to decrease carrier mobility. For example, a tensile strain-inducing silicon nitride layer can be deposited onto a PMOS transistor by CVD deposition. This tensile strain of the channel decreases hole mobility for a desired device operation or design. Conversely, a compressive strain-inducing layer can be deposited onto a NMOS transistor to decrease electron mobility. In one exemplary embodiment, using appropriate masking techniques, a first strain-inducing layer may be formed on source/drain regions 134 of first MOS transistor 136 and a second strain-inducing layer may be formed on source/drain regions 134 of second MOS transistor 138. The first and second strain-inducing layers can both be tensile or compressive strain-inducing layers that apply different magnitudes of stress to the channel regions of the transistors. In another exemplary embodiment, the first strain-inducing layer may be a tensile strain-inducing layer formed on first MOS transistor 136 to improve or degrade its device performance and the second strain-inducing layer may be a compressive strain-inducing layer formed second MOS transistor 138 to improve or degrade its device performance. Stress layer 142 may comprise any material that, when deposited on the front surface of semiconductor substrate 102, applies a uniaxial tensile or compressive stress on the channel regions 144 of MOS transistor 136 and/or 138. Examples of suitable materials include, but are not limited to, silicon oxide ($SiO_X$, where $0<X$), silicon nitride (SiN), silicon oxynitride ($SiO_XN_Y$, where $0<X$ and $0<Y$), and combinations thereof. Other materials may include any pseudomorphic material that can be grown on the silicon substrate with a different lattice constant than the lattice constant of silicon. The difference in lattice constant of the two juxtaposed materials creates a stress in the host material. The strain-inducing material can be, for example, monocrystalline germanium silicide (GeSi) having up to about 50 atomic percent germanium, silicon carbide (SiC) and its derivatives, and the like. The stress layer 142 may be formed, for example, by CVD or PECVD.

Figure 3:
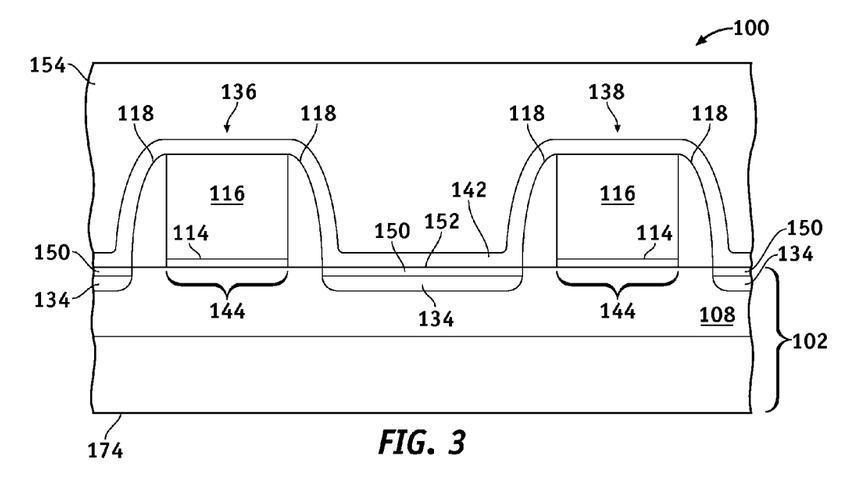
Figure 4:
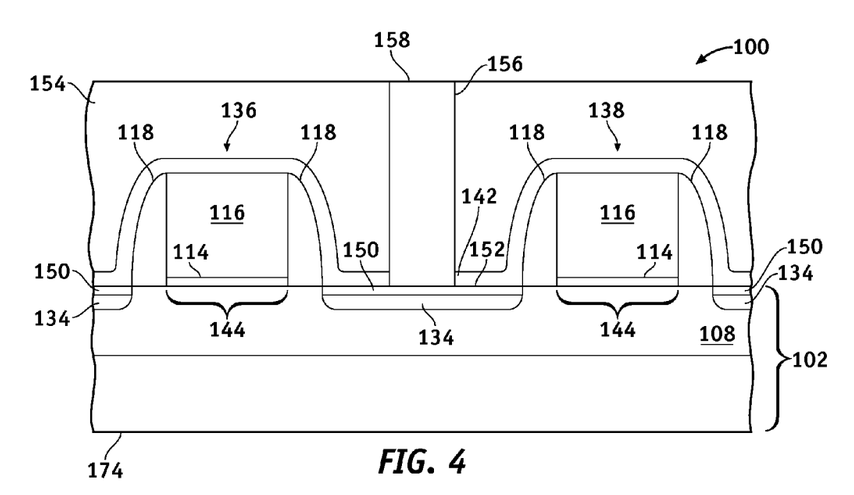

Referring to FIG. 3, the method continues, in accordance with an exemplary embodiment of the present invention, with the deposition of a blanket dielectric layer 154 on semiconductor structure 100. The dielectric layer 154 can be formed from, for example, silicon dioxide or tetraethylorthosilicate (TEOS). The dielectric layer 154 and the highly intrinsically-stressed layer 142 are photolithographically patterned and etched to form a contact opening 156 extending through dielectric layer 154 and highly intrinsically-stressed layer 142 and exposing at least a portion of metal silicide layer 150 at front surface 152 of substrate 102, as illustrated in FIG. 4. The dielectric layer may be planarized by a CMP process before patterning. A conductive contact 158 is formed in contact opening 156 so that the source and drain regions can be appropriately connected electrically to other devices in the integrated circuit to implement the desired circuit function. In an exemplary embodiment of the present invention, conductive contact 158 is formed by the deposition of a first thin barrier layer, such as, for example, titanium, and a second thin barrier layer, such as, for example, TiN, within contact opening 156, followed by the deposition of a conductive plug, such as, for example, W. The barrier layer is used to prevent diffusion of tungsten hexafluoride $WF_6$, used during formation of conductive plug, into the insulating layer 154 and to enhance adhesion of the conductive plug to the walls of the contact opening. It will be appreciated that other layers may be utilized to form conductive contact 158. For example, a layer of tantalum may be deposited before the first thin barrier layer is formed.

Figure 5:
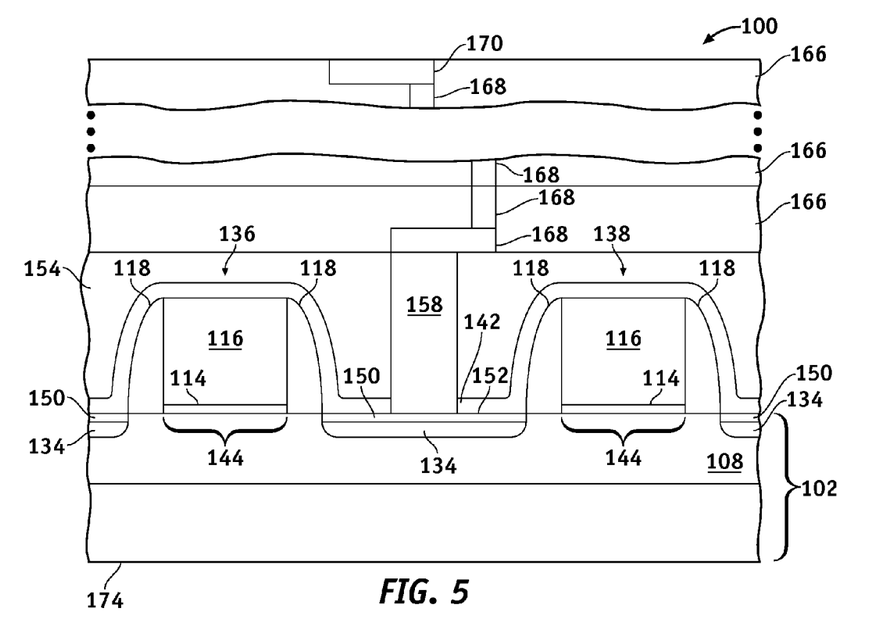

Referring to FIG. 5, after formation of conductive contact 158, a plurality of dielectric layers 166 may be formed overlying dielectric layer 154. Within each of the dielectric layers is one or more conductive connections 168 that are formed so as to be in electrical communication with conductive contact 158 and, thus, the source/drain regions 134 of MOS transistor 136 and/or MOS transistor 138. The conductive connections 168 provide an electrical communication path between the source/drain regions of transistors 136 and 138 and other devices in the integrated circuit to implement the desired circuit function. The conductive connections 168 may be formed by various techniques known in the art. For example, the conductive connections can be formed by damascene methods that involve the etching of trenches and/or vias in the dielectric layers and depositing a conductive material, such as aluminum or copper, therein. Alternatively, or in combination, the conductive connections can be formed by depositing layers of conductive material, such as aluminum or copper, on the dielectric layers, etching the conductive layers to form the conductive connections and depositing additional dielectric material on the conductive connections. In one exemplary embodiment, the conductive connections are in electrical communication with a conductive pad 170 that provides external electrical access to the MOS transistors 136 and 138. While illustrated in FIG. 5, it will be appreciated that conductive pad 170 can be formed at any suitable location of semiconductor structure 100 such that electrical access to MOS transistor 136 and/or MOS transistor 138 is possible.

Figure 6:
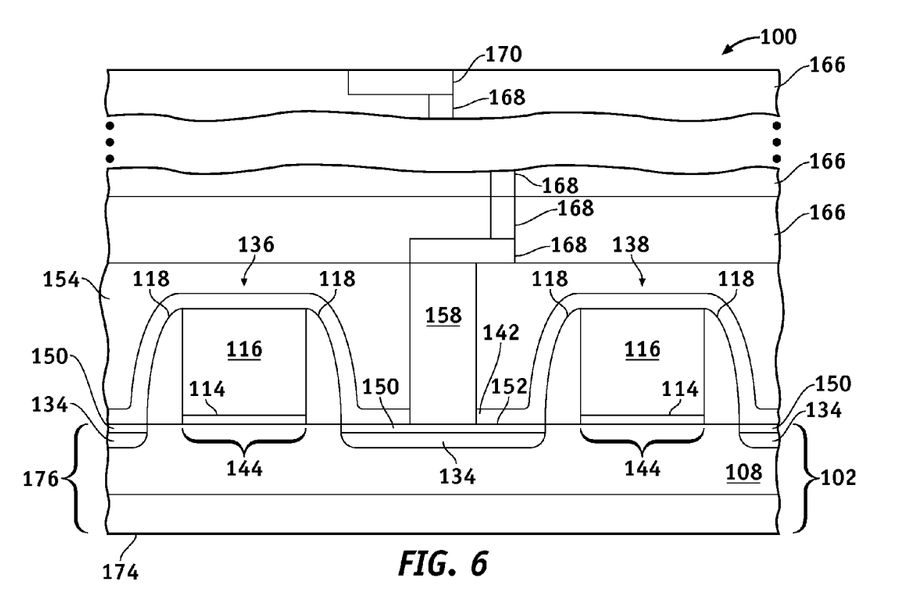

In an exemplary embodiment of the invention, after fabrication of semiconductor structure 100 is completed, and before dicing, packaging and assembly of the semiconductor structure 100, a portion of semiconductor substrate 102 may be removed from back or bottom surface 174 of substrate 102, as illustrated FIG. 6. Semiconductor substrate 102 may be thinned using any suitable conventional method, such as mechanical grinding, wet or dry etching, CMP, and the like, or a combination of such methods. A thickness 176 of the remaining semiconductor substrate 102 may be based on a predetermined overall stress to be applied to the channel regions 144, as described in more detail below. By thinning semiconductor substrate 102 after semiconductor structure 100 is completed, that is, after all dielectric layers 166 and conductive connections 168 have been formed, semiconductor structure 100 is less susceptible to chipping, cracking, or breaking than if semiconductor structure 100 was thinned, for example, during fabrication of the MOS transistors or during formation of the dielectric layers 166 and conductive connections 168.

Figure 7:
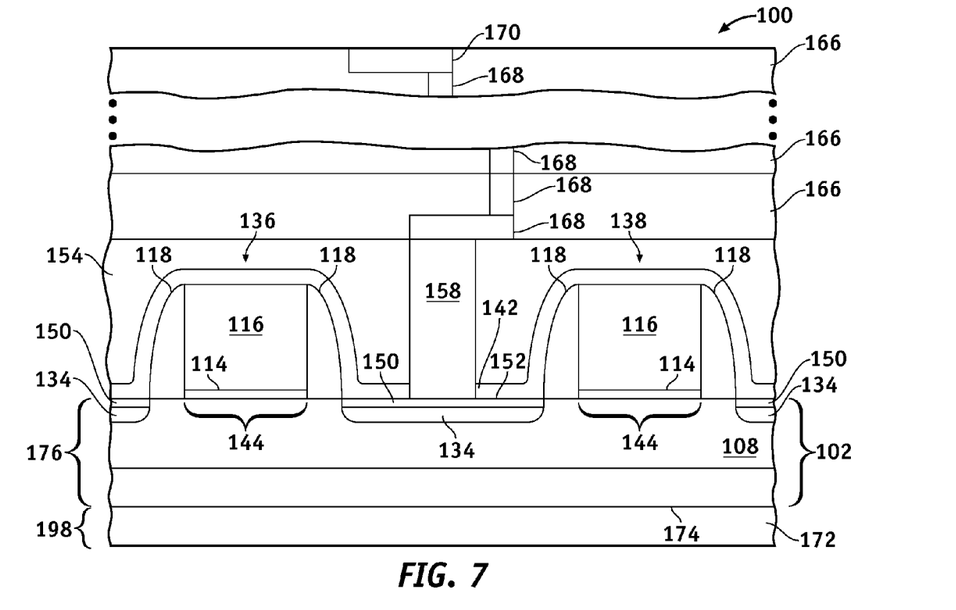

After any thinning of substrate 102 is completed, and before dicing, packaging and assembly of the semiconductor structure, the method continues, in accordance with an exemplary embodiment of the present invention, with the formation of a backside stress layer 172 on back surface 174 of substrate 102 underlying MOS transistor 136 and MOS transistor 138, as illustrated in FIG. 7. As used herein, the term "backside stress layer" refers to a stress layer formed on the back surface of a semiconductor substrate, that is, on the surface opposite to the surface 152 upon and within which an MOS transistor is formed. Stress layers formed on the back surface 174 of substrate 102 also can be used to impart stresses to the channel regions 144 of MOS transistors to enhance or degrade the transistors' performance. For example, a stress layer on the back surface 174 of substrate 102 can be configured to increase the mobility of electrons in an NMOS transistor by applying a longitudinal tensile stress to the channel. Similarly, a stress layer on the back surface 174 of substrate 102 can be configured to increase the mobility of holes in a PMOS transistor by applying a longitudinal compressive stress to the channel. Alternatively, a stress layer on the back surface 174 of substrate 102 can be configured to decrease the mobility of electrons in an NMOS transistor by applying a longitudinal compressive stress to the channel. Similarly, a stress layer on the back surface 174 of substrate 102 can be configured to decrease the mobility of holes in a PMOS transistor by applying a longitudinal tensile stress to the channel. Backside stress layers can result in stresses that are complimentary to or opposite to the stresses exerted on channel regions by any frontside stress layers, such as stress layer 142. In this regard, an overall stress may be applied to the channel to achieve a predetermined overall strain of the channel. Stress layer 172 may comprise any material that, when deposited on the back surface 174 of semiconductor substrate 102, applies a uniaxial tensile or compressive stress on the channel regions 144 of MOS transistor 136 and or 138. Any of the materials described above for the formation of frontside stress layer 142 may be used to form backside stress layer 172. In addition, other materials that may be used to form backside stress layer 172 include metals, such as tantalum, tantalum nitride, titanium, titanium nitride, tungsten, nickel, vanadium, and the like. In addition to applying stress to channel regions of MOS transistors, a metal stress layer formed on the backside of the substrate also may be used for electrical connections. The stress layer 172 may be formed by, for example, CVD or PECVD. If the stress layer is formed of a dielectric material, the stress layer may be able to induce greater stress in the channel regions if it is treated with ultraviolet radiation after it is deposited on the back surface of the substrate.

The backside stress layer 172 has a thickness that is sufficient to apply a uniaxial stress on channel regions 144 but is not so thick that substrate 102 is overstrained and, hence, defected. Because material layers overlying the MOS transistors, such as dielectric layers 154 and 166, can inherently apply stress to the channel regions due to differences in composition of the layers, in a preferred embodiment of the invention, the backside stress layer 172 has a composition and thickness 198 that are determined based, at least in part, on the stresses applied to the channel regions 144 by material layers that overlie the front surface 152 of substrate 102 so that an overall stress is applied to the channel regions to achieve a predetermined overall strain of the channel regions. For example, the backside stress layer 172 may be configured based on the composition and thickness of one or more frontside stress layers 142 and one or more dielectric layers, for example, dielectric layer 154 and dielectric layers 166, overlying the front surface 152 of substrate 102. In addition, the backside stress layer 172 may be configured based on the thickness 176 of substrate 102. In this regard, an overall stress may be applied to the channel regions 144 to achieve a predetermined overall strain of the channel regions and, hence, a predetermined enhancement in device performance. After formation of stress layer 172, semiconductor structure 100 may be subjected to packaging and assembly techniques as are well-known in industry.

Backside stress layers formed in accordance with the embodiments of the method described above overcome drawbacks of prior art stress layers. For example, by forming stress layer 172 after MOS structure 100 is completed, that is, after all dielectric layers 166 and conductive connections 168 have been formed, stress layer 172 is not subjected to thermal processes that are used during fabrication of the MOS transistors and/or thermal processes that are used during fabrication of dielectric layers 166 and conductive connections 168. Such thermal processes may degrade physical and/or chemical characteristics of stress layer 172, thus decreasing the effectiveness of the stress layer 172. In addition, the thicknesses of frontside stress layers applied to a top surface of an MOS structure are limited by design rules and, accordingly, the stress applied to channel regions by these stress layers is limited. By utilizing stress layers formed on back surfaces of semiconductor substrates, additional straining of the channel regions can be achieved. Further, the thickness of backside stress layers are not as limited by design rules as frontside stress layers, and thus the backside stress layers can be configured to any desired thickness.

Figure 8:
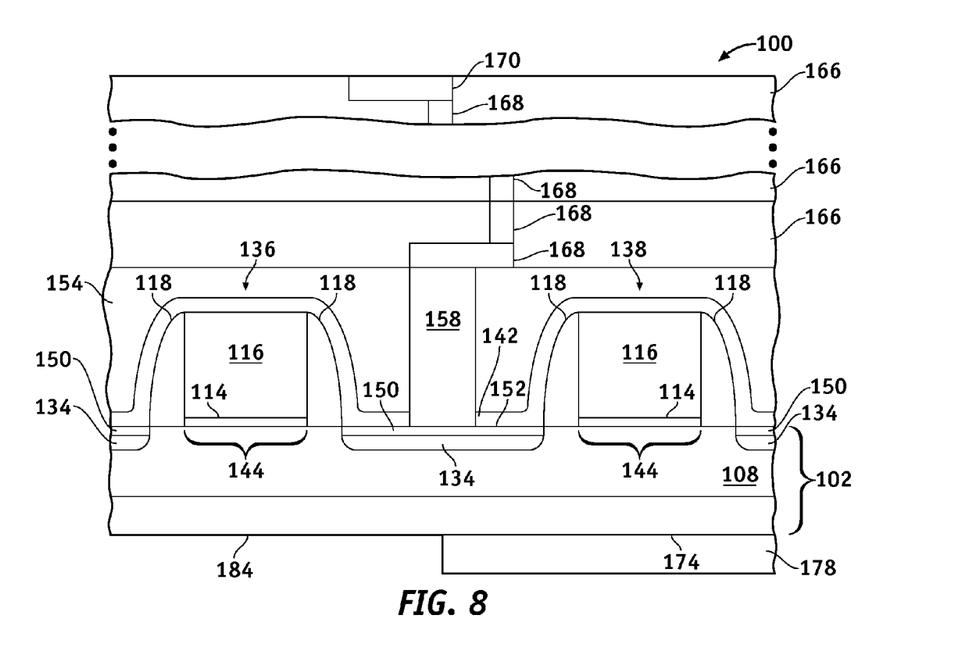
FIGS. 8-9 illustrate, in cross section, a method for fabricating a semiconductor structure in accordance with another exemplary embodiment of the present invention.
Figure 9:
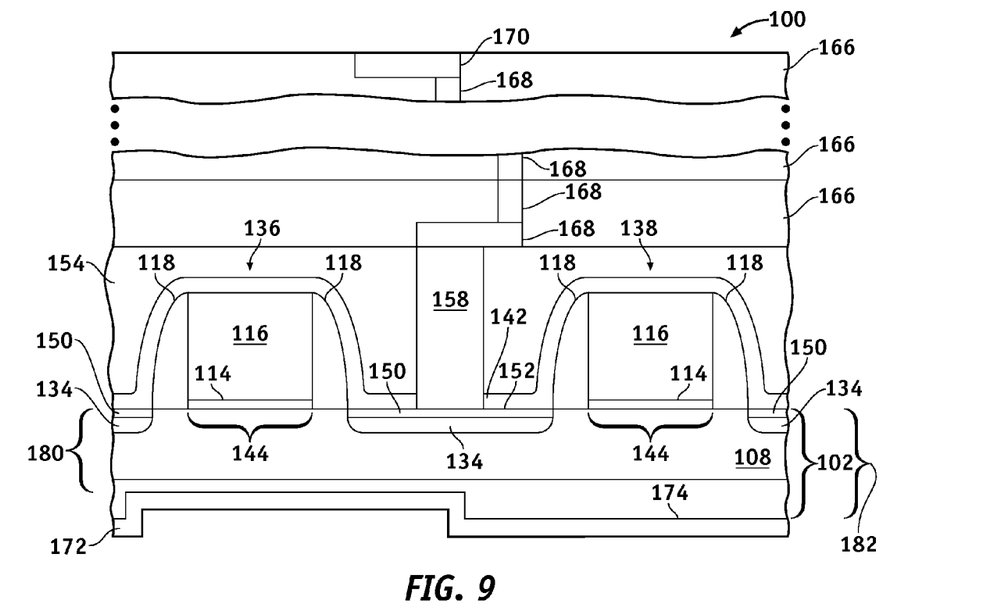

FIGS. 8-9 illustrate a method in accordance with another exemplary embodiment of the present invention for fabricating semiconductor structure 100 such that the thickness of the semiconductor substrate 102 underlying at least a portion of first MOS transistor 136 may be different from that underlying second MOS transistor 138. The stress applied on a channel region by a backside stress layer increases as the thickness of the semiconductor substrate underlying the channel region decreases. In this regard, referring to FIG. 8, after the steps described above with reference to FIGS. 1-6 are performed, a photoresist 178 may be applied to back surface 174 of semiconductor substrate 102 and patterned to expose a portion 184 of back surface 174 that underlies at least a portion, such as the channel region 144, of first MOS transistor 136. The exposed portion 184 of back surface 174 of substrate 102 then may be etched so that substrate 102 has a first thickness 180 underlying first MOS transistor 136 and a second thickness 182 underlying larger second MOS transistor 138, as illustrated in FIG. 9. The photoresist is removed and stress layer 172 then is formed on back surface 174 of substrate 102. Accordingly, due to the difference in thickness of substrate 102, the overall stress applied to channel region 144 of first MOS transistor 136 can be different from the overall stress applied to channel region 144 of second MOS transistor 136. It will be appreciated that semiconductor substrate 102 may be thinned by any of the methods described above prior to the application of photoresist 178.

Figure 10:
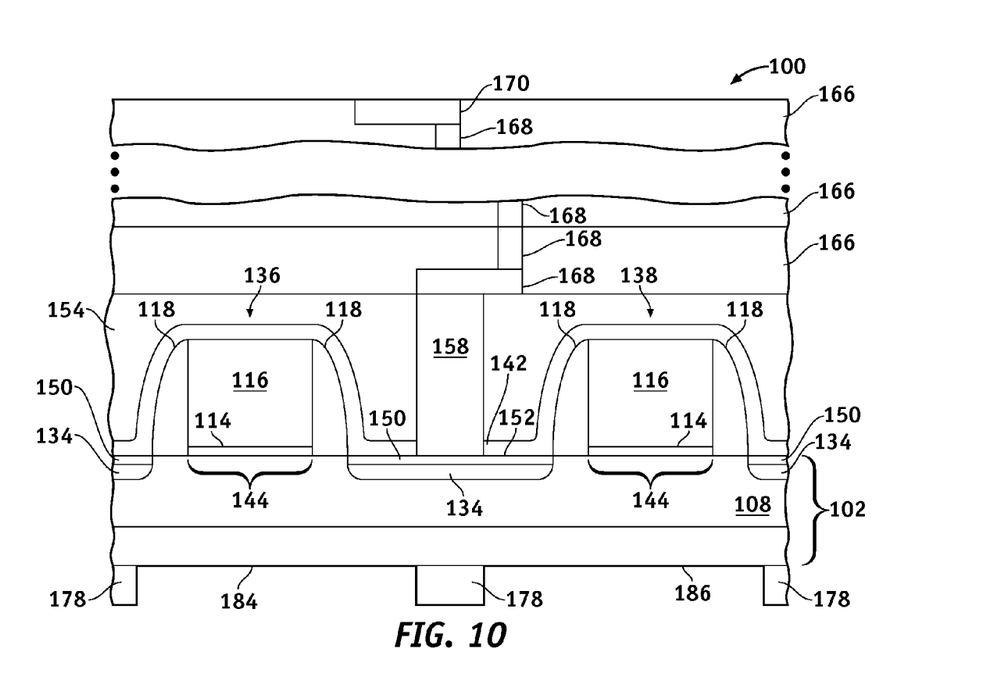
FIGS. 10-11 illustrate, in cross section, a method for fabricating a semiconductor structure in accordance with a further exemplary embodiment of the present invention.
Figure 11:
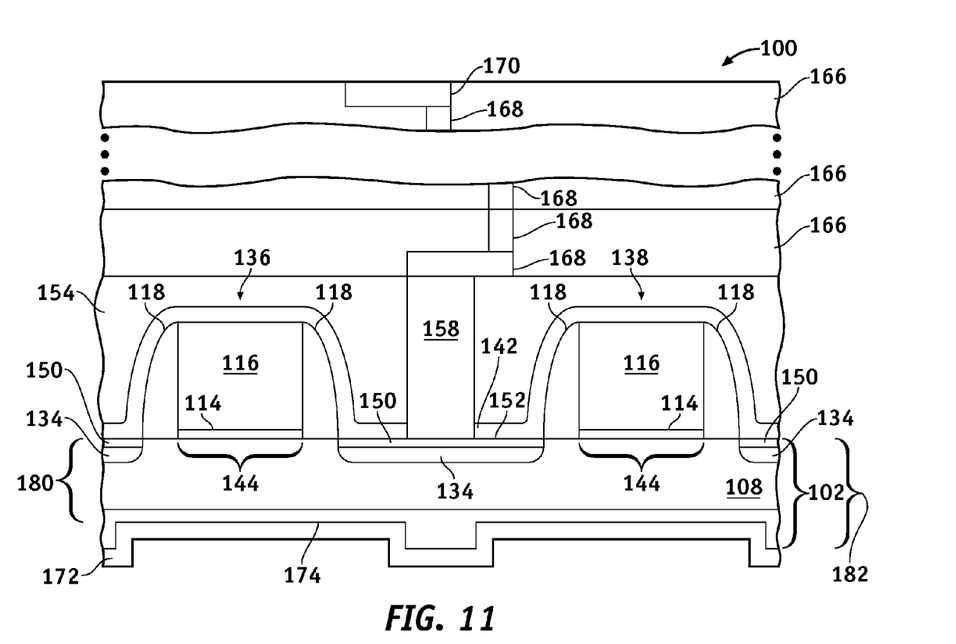

FIGS. 10-11 illustrate a method, in accordance with an exemplary embodiment of the present invention, for fabricating semiconductor structure 100 such that the thickness of the semiconductor substrate 102 is less underlying at least a portion of the MOS transistors than between the transistors. In this regard, referring to FIG. 10, after the steps described above with reference to FIGS. 1-6 are performed, photoresist 178 may be patterned to expose not only portion 184 of back surface 174 underlying at least a portion, such as, for example, channel region 144, of first MOS transistor 136 but also may be patterned to expose a portion 186 of back surface 174 underlying at least a portion, such as, for example, channel region 144, of second MOS transistor 138. The exposed portions 184 and 186 are etched so that substrate 102 has a first thickness 180 underlying MOS transistors 136 and 138 and a second thickness 182 between the transistors, as illustrated in FIG. 11. The photoresist is removed and stress layer 172 then is formed on back surface 174 of substrate 102. Accordingly, due to the smaller thickness 180 of substrate 102, the stress layer 172 may apply a desired stress on channel regions 144 while the larger thickness 182 of substrate 102 supports the structure and prevents chipping, cracking or breaking during packaging and assembly.

Figure 12:
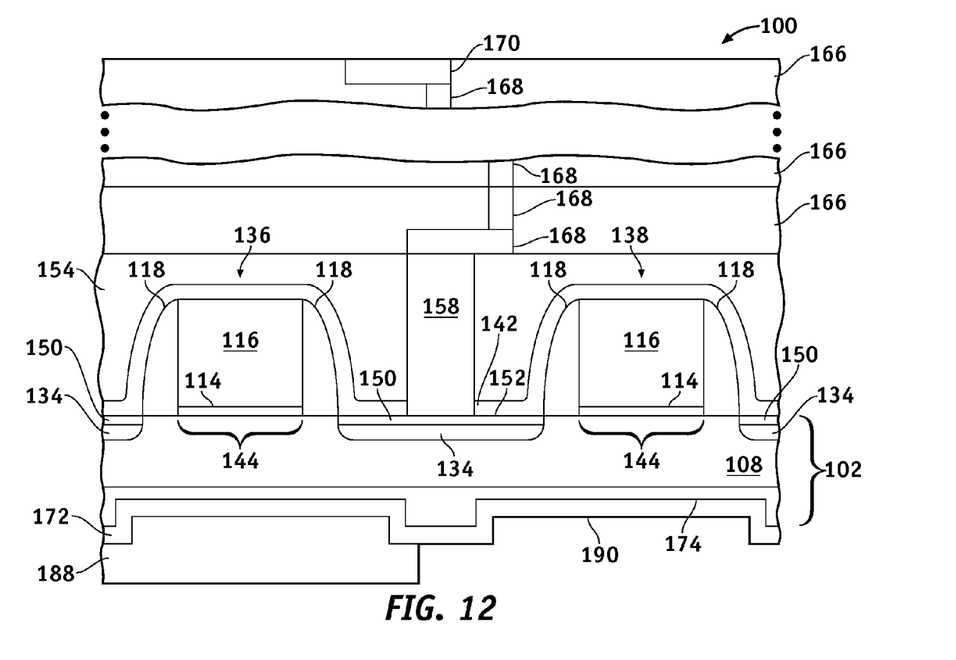
FIGS. 12-14 illustrate, in cross section, a method for fabricating a semiconductor structure in accordance with yet another exemplary embodiment of the present invention.
Figure 13:
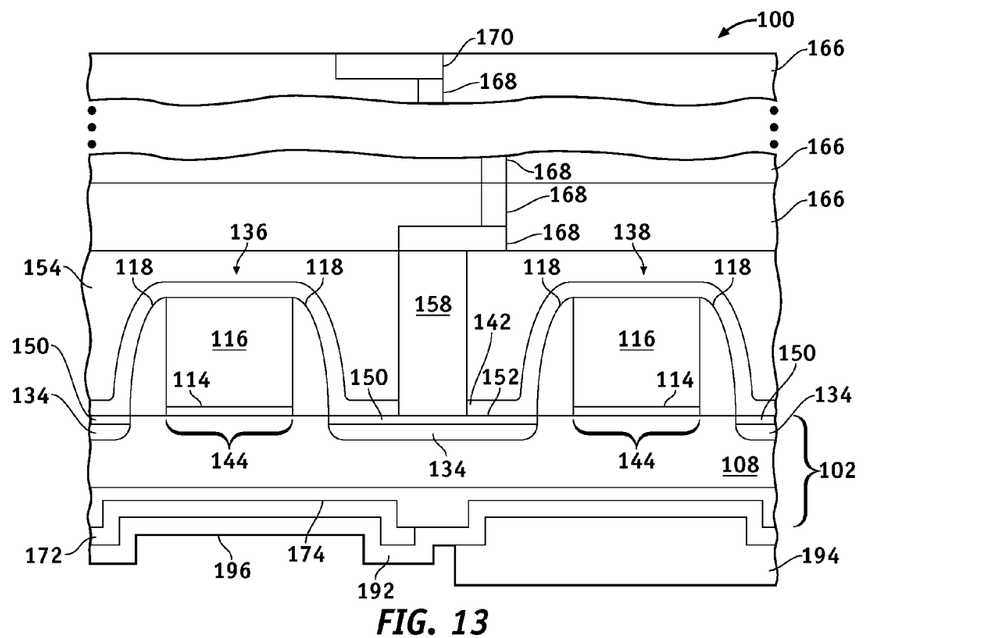
Figure 14:
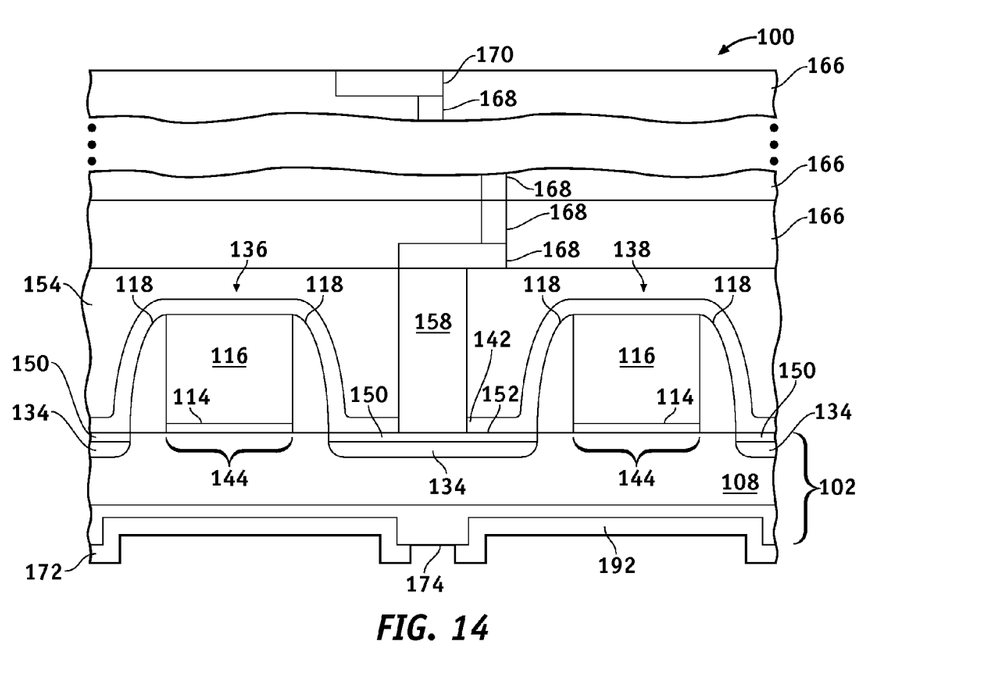

FIGS. 12-14 illustrate a method, in accordance with an exemplary embodiment of the present invention, for fabricating semiconductor structure 100 such that a first backside strain-inducing layer is formed underlying first MOS transistor 136 and an optional second strain-inducing layer is formed underlying second MOS transistor 138. In one exemplary embodiment, the first and second strain-inducing layers can both be tensile or compressive strain-inducing layers that apply different magnitudes of stress to the channel regions. In another exemplary embodiment, the first strain-inducing layer may be a tensile strain-inducing layer and the second strain-inducing layer may be a compressive strain-inducing layer. In this regard, referring to FIG. 12, after the steps described above with reference to FIGS. 1-6 are performed and, optionally, after the steps described above with reference to FIGS. 10-11 are performed, a photoresist 188 is deposited overlying first strain-inducing layer 172 and is patterned to expose a portion 190 of first strain-inducing layer 172 that underlies second MOS transistor 138. Exposed portion 190 of first strain-inducing layer 172 is etched to expose surface 174 of substrate 102 and photoresist 188 is removed. In an optional embodiment, a second strain-inducing layer 192 is formed overlying first strain-inducing layer 172 and back surface 174 of substrate 102, as illustrated in FIG. 13. Another photoresist 194 is formed on second strain-inducing layer 192 and is patterned to expose a portion 196 of second strain-inducing layer 192 that overlies first strain-inducing layer 172. Referring to FIG. 14, exposed portion 196 of second strain-inducing layer 192 is removed to expose first strain-inducing layer 172 and the photoresist 194 then is removed. It will be appreciated that, if MOS transistor 136 is an NMOS transistor and MOS transistor 138 is a PMOS transistor, an end of each of the strain-inducing layers may terminate at a region underlying the STI that separates the transistors.

Accordingly, methods for fabricating semiconductor structures with backside stress layers have been provide. The methods provide for the formation of the backside stress layers after all semiconductor device fabrication has been completed and after all dielectric layers and conductive connections have been formed on the semiconductor devices. In this regard, the backside stress layers are not subjected to thermal processes that are used during fabrication of the semiconductor devices and/or thermal processes that are used during fabrication of the overlying dielectric layers and conductive connections. In addition, by utilizing backside stress layers, further straining of the channel regions of the semiconductor devices can be achieved in addition to straining resulting from stress layers formed on the front surfaces of the substrates. Further, the thicknesses of backside stress layers are not as limited by design rules as stress layers formed on the front surfaces are, and thus the backside stress layers can be configured to any desired thickness. Moreover, because the backside stress layers are formed after semiconductor device fabrication is completed, and after any thinning of the semiconductor substrate is performed, the backside stress layers are not removed from the semiconductor structure and can be used to enhance device performance during operation.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor structure, the method comprising the steps of:
providing a semiconductor device formed on and within a front surface of a semiconductor substrate, the semiconductor device comprising a channel region;
forming a plurality of dielectric layers overlying the semiconductor device, wherein the plurality of dielectric layers comprises conductive connections that are in electrical communication with the semiconductor device;
applying a photoresist to a back surface of the semiconductor substrate, after the steps of providing and forming;
patterning the photoresist to expose a portion of the back surface of the semiconductor substrate;
etching the substrate so that the substrate has a first thickness underlying the semiconductor device and a second thickness underlying another portion of the semiconductor substrate that is different than the first thickness;
removing the photoresist from the semiconductor substrate; and
forming a backside stress layer on the back surface of the semiconductor substrate, wherein the backside stress layer is configured to apply to the channel region of the semiconductor device a uniaxial compressive or tensile stress that, with stresses applied by the plurality of dielectric layers, results in an overall stress exerted on the channel region to achieve a predetermined overall strain of the channel region.

2. The method of claim 1, further comprising, after the step of providing the semiconductor device and before the step of forming the plurality of dielectric layers, the step of forming a frontside stress layer overlying the semiconductor device and the front surface of the semiconductor substrate.

3. The method of claim 2, wherein, the step of forming the backside stress layer comprises the step of forming the backside stress layer so that it is configured to apply to the channel region of the semiconductor device a uniaxial compressive or tensile stress that, with stresses applied by the plurality of dielectric layers and the frontside stress layer, results in the overall stress exerted on the channel region to achieve the predetermined overall strain of the channel region.

4. The method of claim 1, wherein the step of etching comprises the step of removing a portion of the semiconductor substrate from the back surface underlying at least a portion of the semiconductor device.

5. The method of claim 4, further comprising, after the step of forming the plurality of dielectric layers and before the step of applying a photoresist, the step of thinning the semiconductor substrate at the back surface.

6. The method of claim 1, wherein the step of providing the semiconductor device on and within the front surface of the semiconductor substrate comprises the step of fabricating a first semiconductor device and a second semiconductor device on and within the front surface of the semiconductor substrate, and wherein the step of forming the backside stress layer comprises the step of forming a first backside stress layer underlying the first semiconductor device and the second semiconductor device and removing a portion of the first backside stress layer that underlies the second semiconductor device.

7. The method of claim 6, further comprising, after the step of removing the portion of the first backside stress layer, the step of forming a second backside stress layer underlying the second semiconductor device.

8. The method of claim 7, wherein the step of forming the first backside stress layer underlying the first semiconductor device comprises the step of forming a tensile strain-inducing layer underlying the first semiconductor device and wherein the step of forming the second backside stress layer underlying the second semiconductor device comprises the step of forming a compressive strain-inducing layer underlying the second semiconductor device.

9. The method of claim 7, further comprising, after the step of forming the plurality of dielectric layers and before the step of forming the first backside stress layer, the step of removing a first portion of the semiconductor substrate from the back surface underlying the first semiconductor device and a second portion of the semiconductor substrate from the back surface underlying the second semiconductor device.

10. The method of claim 1, wherein the step of providing the semiconductor device formed on and within the front surface of the semiconductor substrate comprises the step of providing an MOS transistor formed on and within the front surface of the semiconductor substrate.

11. A method for fabricating an semiconductor structure, the method comprising the steps of:
providing a semiconductor substrate having a front surface and a back surface;
fabricating a first MOS transistor and a second MOS transistor on and within the front surface of the semiconductor substrate, wherein the first MOS transistor and the second MOS transistor each comprise a channel region;
forming overlying the first and second MOS transistors a plurality of dielectric layers comprising conductive connections that are in electrical communication with the first and second MOS transistors;
after the step of forming the plurality of dielectric layers, applying a photoresist to the back surface of the semiconductor substrate;
patterning the photoresist to expose a portion of the back surface of the semiconductor substrate;
etching the substrate so that the substrate has a first thickness underlying at least one of the first and second MOS transistors and a second thickness underlying another portion of the semiconductor substrate that is different than the first thickness;
removing the photoresist from the semiconductor substrate; and
forming a backside stress layer on the back surface of the semiconductor substrate underlying at least one of the first and second MOS transistors.

12. The method of claim 11, further comprising, after the step of forming overlying the first and second MOS transistors the plurality of dielectric layers and before the step of applying a photoresist, the step of thinning the semiconductor substrate from the back surface.

13. The method of claim 11, further comprising the step of subjecting the backside stress layer to ultraviolet radiation.

14. The method of claim 11, wherein the step of forming the backside stress layer comprises the step of configuring the backside stress layer to have a composition and a thickness such that the backside stress layer applies a stress that interacts with stresses applied by the plurality of dielectric layers to achieve a predetermined overall strain of the channel region of at least one of the first and second MOS transistors.

15. The method of claim 11, wherein the step of etching comprises the step of removing a portion of the semiconductor substrate underlying the at least one of the first and second MOS transistors.

16. The method of claim 11, wherein the step of forming the backside stress layer comprises the step of forming a first backside stress layer underlying the first MOS transistor and the second MOS transistor and removing the first backside stress layer from underlying the second MOS transistor.

17. The method of claim 16, wherein the step of forming the backside stress layer further comprises, after the step of removing the first backside stress layer, the step of forming a second backside stress layer underlying the second MOS transistor.

18. The method of claim 17, wherein the step of forming the first backside stress layer underlying the first MOS transistor comprises the step of forming a tensile strain-inducing layer underlying the first MOS transistor and wherein the step of forming the second backside stress layer underlying the second MOS transistor comprises the step of forming a compressive strain-inducing layer underlying the second MOS transistor.

19. The method of claim 11, further comprising, after the step of fabricating the first MOS transistor and the second MOS transistor and before the step of forming overlying the first and second MOS transistors the plurality of dielectric layers, the step of forming a frontside stress layer overlying at least a portion of at least one of the first and second MOS transistors.

20. A method for improving a performance of a semiconductor structure, the method comprising the steps of:
providing a semiconductor structure comprising a semiconductor substrate having a semiconductor device formed on and within a front surface of the semiconductor substrate and a plurality of dielectric layers overlying the semiconductor structure, wherein the plurality of dielectric layers comprise conductive connections that are in electrical communication with the semiconductor device;
removing a portion of the semiconductor substrate from a back surface of the semiconductor substrate;
applying a photoresist to the back surface of the semiconductor substrate;
patterning the photoresist to expose a portion of the back surface of the semiconductor substrate;
etching the substrate so that the substrate has a first thickness underlying at least one of the first and second MOS transistors and a second thickness underlying another portion of the semiconductor substrate that is different than the first thickness;
removing the photoresist from the semiconductor substrate; and
forming a stress layer on the back surface of the semiconductor substrate underlying the semiconductor device.

* * * * *